US010941588B2

(12) United States Patent
He et al.

(10) Patent No.: US 10,941,588 B2
(45) Date of Patent: Mar. 9, 2021

(54) ELECTRIC LOCK AND DISPLAY SCREEN USING THE SAME

(71) Applicant: Unilumin Group Co., Ltd., Guangdong (CN)

(72) Inventors: Jinfeng He, Guangdong (CN); Zhenli Yang, Guangdong (CN)

(73) Assignee: UNILUMIN GROUP CO., LTD., Shenzhen (CN)

(*) Notice: Subject to any disclaimer, the term of this patent is extended or adjusted under 35 U.S.C. 154(b) by 236 days.

(21) Appl. No.: 16/309,389

(22) PCT Filed: Jan. 12, 2018

(86) PCT No.: PCT/CN2018/072416
§ 371 (c)(1),
(2) Date: Dec. 12, 2018

(87) PCT Pub. No.: WO2018/188397
PCT Pub. Date: Oct. 18, 2018

(65) Prior Publication Data
US 2019/0309540 A1 Oct. 10, 2019

(30) Foreign Application Priority Data
Apr. 10, 2017 (CN) .......... 201710228348.X

(51) Int. Cl.
E05B 47/00 (2006.01)
H05K 5/02 (2006.01)
(Continued)

(52) U.S. Cl.
CPC .......... *E05B 47/0012* (2013.01); *E05B 49/00* (2013.01); *G09F 9/33* (2013.01);
(Continued)

(58) Field of Classification Search
CPC ................ E05B 47/0012; E05B 49/00; E05B 2047/002; E05B 2047/0023;
(Continued)

(56) References Cited

U.S. PATENT DOCUMENTS 1,419,516 A * 6/1922 Pomeranz ............... E05B 63/12
70/134
3,081,078 A * 3/1963 Lohr ....................... E05B 81/22
49/139
(Continued)

FOREIGN PATENT DOCUMENTS

| CN | 102943802 A | 2/2013 |
|----|-------------|--------|
| CN | 203584988 U | 5/2014 |

(Continued)

OTHER PUBLICATIONS

The extended European search report dated Dec. 19, 2019 from corresponding application No. EP 18785041.7.
(Continued)

*Primary Examiner* — Lloyd A Gall
(74) *Attorney, Agent, or Firm* — Hauptman Ham, LLP

(57) ABSTRACT

Provided are an electric lock and a display screen using the same. The electric lock comprises a main lock and a secondary lock. The main lock comprises a housing, a driving assembly comprising a driving member and a rotating shaft which is rotatably arranged on the housing, and a first connecting member. The secondary lock comprises a first sleeve, an elastic member and a second connecting member which is rotatably arranged in the first sleeve. The second connecting member is able to move along the axis of the first sleeve. The driving member drives the first connecting member to move along its axis, and rotates the first connecting member when the first connecting member abuts
(Continued)

against the second connecting member. The electric lock is simple in structure, convenient to operate and small in size.

10 Claims, 4 Drawing Sheets

(51) Int. Cl.
*H02K 7/06* (2006.01)
*E05B 49/00* (2006.01)
*G09F 9/33* (2006.01)

(52) U.S. Cl.
CPC ......... *H05K 5/0208* (2013.01); *H05K 5/0221* (2013.01); *H05K 5/0226* (2013.01)

(58) Field of Classification Search
CPC .. H05K 5/0226; H05K 5/0208; H05K 5/0221; G09F 9/33; H02K 7/06
USPC ...... 70/140, 277, 278.1–278.3, 278.7, 279.1, 70/280–283, 283.1; 292/144
See application file for complete search history.

(56) References Cited

U.S. PATENT DOCUMENTS

| | | | | |
|---|---|---|---|---|
| 3,157,215 A | * | 11/1964 | Zahodiakin | F16B 37/0857 411/267 |
| 4,974,888 A | * | 12/1990 | Childers | F16B 39/36 292/251 |
| 4,993,247 A | * | 2/1991 | Minemura | E05B 5/003 292/251 |
| 5,106,251 A | * | 4/1992 | Steinbach | F16B 37/085 292/251 |
| 5,160,180 A | * | 11/1992 | Mlynarczyk | E05B 5/003 292/251 |
| 5,546,777 A | * | 8/1996 | Liu | E05B 81/25 292/144 |
| 5,813,257 A | * | 9/1998 | Claghorn | E05B 5/003 292/201 |
| 6,684,671 B2 | * | 2/2004 | Beylotte | E05B 17/0029 292/144 |
| 7,191,624 B2 | * | 3/2007 | Beylotte | E05B 17/0029 292/144 |
| 2002/0083747 A1 | | 7/2002 | Beylotte et al. | |
| 2003/0217495 A1 | | 11/2003 | Nagamine et al. | |
| 2012/0017517 A1 | * | 1/2012 | Lee | E05B 83/363 49/503 |

FOREIGN PATENT DOCUMENTS

| | | |
|---|---|---|
| CN | 105161016 A | 12/2015 |
| CN | 106793635 A | 5/2017 |
| CN | 206775868 U | 12/2017 |
| WO | 9626340 A1 | 8/1996 |

OTHER PUBLICATIONS

International search report dated Apr. 18, 2018 from corresponding application No. PCT/CN2018/072416.

* cited by examiner

ELECTRIC LOCK AND DISPLAY SCREEN USING THE SAME

RELATED APPLICATIONS

The present application is a National Phase of International Application Number PCT/CN2018/072416, filed Jan. 12, 2018, and claims the priority of China Application No. 201710228348.X, filed Apr. 10, 2017.

FIELD OF THE INVENTION

The present invention relates to the field of display screens, and more particularly to an electric lock and a display screen using the same.

BACKGROUND OF THE INVENTION

A large LED display screen is usually formed by connecting a plurality of display screen boxes, in which the adjacent display screen boxes are connected by a connecting lock or a connecting plate. The existing connecting lock has a complicated structure, occupying more internal space of the display screen box, such that it not meets the growing trend of the display screen being thinner and lighter. Moreover, it is too troublesome to disassemble the display screen boxes that are connected using the existing connecting lock.

SUMMARY OF THE INVENTION

Technical Problem

The technical problem to be solved by the present invention is to provide an electric lock, which is simple in structure, small in size, and simple in operation. In addition, a display screen using the lock is also provided.

Solution to Problem

Technical Solution

In order to solve such technical problem, the technical solution adopted by the present invention is an electric lock, comprising a main lock which comprises a housing accommodating a driving assembly and a first connecting member, the driving assembly comprising a driving member and a rotating shaft which is rotatably arranged on the housing, a first threaded portion being arranged at one end of the rotating shaft, a second threaded portion adapted to the first threaded portion being arranged at one end of the first connecting member while a third threaded portion being arranged at the other end of the first connecting member, and a secondary lock which comprises a first sleeve, an elastic member and a second connecting member which is rotatably arranged in the first sleeve, the elastic member being arranged in the first sleeve and having one end abutting against the second connecting member, a fourth threaded portion adapted to the third threaded portion being arranged on the second connecting member, the second connecting member being able to move along the axis of the first sleeve;

wherein the driving member drives the first connecting member through the rotating shaft to move along the axis of the rotating shaft; the rotation of the rotating shaft drives the first connecting member to rotate when the first connecting member abuts against the second connecting member.

The disclosure also provides another technical solution: a display screen, wherein adjacent display screen boxes are connected by the above electric lock.

Advantageous Effects of Invention

Advantageous Effects

The invention has the following advantages. The electric lock is divided into a main lock and a secondary lock, and both the main lock and the secondary lock are simple in structure and small in size. The elastic member arranged in the secondary lock is beneficial to reducing the requirement of assembly precision of the electric lock, bringing great convenience to users. It is simple to operate since the connection and separation of the main lock and the secondary lock are electrically controlled. It is convenient for the producer to make a lighter and thinner display screen box, in the case that the display screen adopts the above electric lock.

Figure 1:
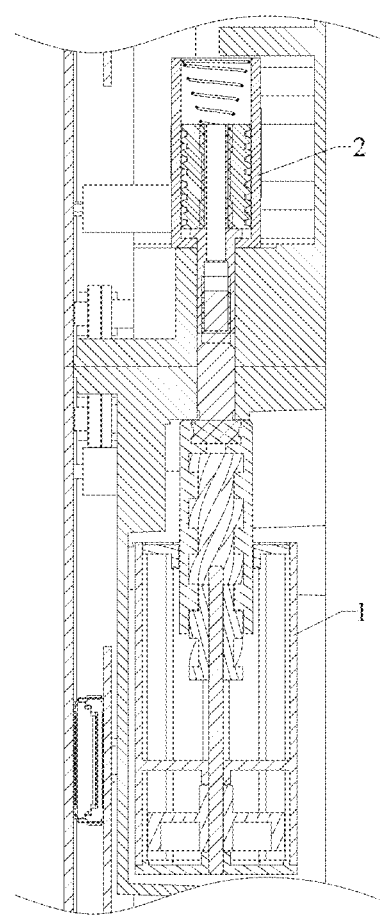
FIG. 1 is a cross-sectional view showing an electric lock connecting two display screen boxes in accordance with Example 1 of the present invention.

REFERENCE NUMERALS 1 main lock, 11 housing, 111 left cavity, 112 right cavity, 113 lower cavity,
12 first connecting member, 13 driving member, 14 rotating shaft, 15 first threaded portion,
16 second threaded portion, 17 reduction gear set, 171 first gear, 172 second gear,
173 third gear, 174 fourth gear, 18 sixth threaded portion,
2 secondary lock,
21 first sleeve, 22 elastic member, 23 second connecting member, 24 manual unlocking assembly,
241 second sleeve, 242 unlocking member, 243 fifth threaded portion, 25 rib plate.

IMPLEMENTATIONS OF THE INVENTION

Detailed Description of the Invention

The key of the present invention is the electric lock which is divided into two parts respectively mounted on the adjacent display screen boxes, wherein the driving member in the main lock drives the first connecting member to move along its axis and to screw in the second connecting member in the secondary lock.

Referring to FIGS. 1-6, an electric lock comprises main lock 1 and secondary lock 2. Main lock 1 comprises housing 11. Drive assembly and first connecting member 12 are arranged in housing 11. The driving assembly comprises driving member 13 and rotating shaft 14 which is rotatably arranged on housing 11. First threaded portion 15 is arranged at one end of rotating shaft 14. Second threaded portion 16 adapted to first threaded portion 15 is arranged at one end of first connecting member 12 while a third threaded portion 26 is arranged at the other end. Secondary lock 2 comprises first sleeve 21, elastic member 22 and second connecting member 23 which is rotatably arranged in first sleeve 21. Elastic member 22 is arranged in first sleeve 21 and has one end abutting against second connecting member 23. A fourth threaded portion 27 adapted to the third threaded portion 26 is arranged on second connecting member 23. Second connecting member 23 is able to move along the axis of first sleeve 21. Driving member 13 drives first connecting member 12 through rotating shaft 14 to move along the axis of rotating shaft 14. The rotation of rotating shaft 14 drives first connecting member 12 to rotate when first connecting member 12 abuts against second connecting member 23.

A display screen, wherein adjacent display screen boxes are connected by the above electric lock.

The structure principle of the electric lock in accordance with the present invention is briefly described as follows. When main lock 1 is connected with secondary lock 2, driving member 13 drives rotating shaft 14 to rotate. At the beginning, first connecting member 12 does not abut against second connecting member 23, and driving member 13 drives rotating shaft 14 to initiate the movement of first connecting member 12 along the axis of rotating shaft 14. The first rotating member contacts second connecting member 23 after moving a distance, and then the axial movement of the first rotating member is restricted. Rotating shaft 14 will rotate first connecting member 12 so that first connecting member 12 screws in second connecting member 23. In addition, secondary lock 2 is provided with elastic member 22 and second connecting member 23 is able to move along the axis of first sleeve 21. In the case where first connecting member 12 contacts second connecting member 23 and the third thread portion cannot engage with the fourth threaded portion, second connecting member 23 can still move slightly so that first connecting member 12 coordinates with second connecting member 23.

As can be seen from the above description, the present invention has the following advantages. The electric lock is divided into a main lock and a secondary lock, and both the main lock and the secondary lock are simple in structure and small in size. The elastic member arranged in the secondary lock is beneficial to reducing the requirement of assembly precision of the electric lock, bringing great convenience to users. It is simple to operate since the connection and separation of the main lock and the secondary lock are electrically controlled. It is convenient for the producer to make a lighter and thinner display screen box, in the case that the display screen adopts the above electric lock.

Furthermore, main lock 1 further comprises reduction gear set 17 arranged in housing 11, by which driving member 13 drives rotating shaft 14 to rotate.

It can be seen from the above description that the reduction gear set provided in main lock may convert a low torque (high speed) of the rotating shaft into a high torque (low speed), which is advantageous for the connection of the first connecting member and the second connecting member.

Furthermore, reduction gear set 17 comprises first gear 171, second gear 172, third gear 173, and fourth gear 174. Second gear 172 comprises a first tooth portion 1721 in connect connection with a second tooth portion 1722, and third gear 173 comprises a third tooth portion 1731 in connection with a fourth tooth portion 1732. First gear 171 is sleeved onto the output shaft of driving member 13. Second gear 172 and third gear 173 are rotatably arranged in housing 11, respectively. Fourth gear 174 is sleeved onto rotating shaft 14. The outer diameter of the first tooth portion 1721 is greater than that of the second tooth portion 1722 and first gear 171, respectively. The outer diameter of the third tooth portion 1731 is greater than that of the second tooth portion 1722 and the fourth tooth portion 1732, respectively. The outer diameter of fourth gear 174 is greater than that of the fourth tooth portion 1732. First gear 171 engages with the first tooth portion 1721, the second tooth portion 1722 engages with the third tooth portion 1731, and the fourth tooth portion 1732 engages with fourth gear 174.

As can be seen from the above description, the present invention adopts a three-stage reduction transmission gear set to achieve multi-stage deceleration without increasing the volume of the main lock.

Further, secondary lock 2 further comprises manual unlocking assembly 24 comprising second sleeve 241 and unlocking member 242. Second sleeve 241 is arranged on the peripheral wall of first sleeve 21 and perpendicular to first sleeve 21. At the junction of first sleeve 21 and second sleeve 241, the hollow region of second sleeve 241 is communicated with the hollow region of first sleeve 21. Fifth threaded portion 243 is arranged on unlocking member 242, and unlocking member 242 is rotatably arranged in second sleeve 241. Sixth threaded portion 18 adapted to fifth threaded portion 243 is arranged on second connecting member 23.

It can be seen from the above description that the manual unlocking member permits manual rotation and unlocking in the case of power failure or motor damage, which greatly improves the operability of the electric lock.

Further, unlocking member 242 has an unlocking hole arranged along its axis.

Further, the unlocking hole is selected from a flat-blade slot, a cross-shaped slot, a triangular slot, a regular hexagonal slot and a screw hole.

It can be seen from the above description that the unlocking member provided with an unlocking hole enables the worker to unlock with tools, which is beneficial to reducing the difficulty of manually unlocking the electric lock, reducing the labor intensity and improving the unlocking efficiency. In addition, the shape/form of the unlocking hole may not be limited as described above. It is also allowable to provide the unlocking hole in a non-standard shape, which may be helpful for preventing others from maliciously unlocking the electric lock and causing property damage. In order to facilitate the unlocking, it is not necessary to provide the unlocking hole on the unlocking member. For example, it is also allowable to provide a rotating portion, by which people may manually rotate to unlock.

Further, a cover may be provided at the end of first sleeve 21 away from second connecting member 23, and the other end of elastic member 22 abuts against the cover.

In the case where the cover is not provided, one end of the elastic member abuts against the second connecting member and the other end abuts against the side wall of the mounting position in which it is received. In the case where the cover is provided, two ends of the elastic member abut against the second connecting member and the cover, respectively. The cover is advantageous to avoid the loss of the elastic member in the process of installation or maintenance of the secondary lock.

Further, secondary lock 2 further comprises rib plate 25 arranged on the peripheral wall of first sleeve 21, and rib plate 25 is provided with a mounting hole.

It can be seen from the above description that the rib plate provided with a mounting hole is enable to keep the position of the secondary lock unchanged at the mounting position, which is beneficial to improving the stability of the electric lock.

Example 1

Referring to FIGS. 1-6, Example 1 in accordance with the present invention provides a display screen, in which adjacent display screen boxes are connected by an electric lock, and the electric lock comprises main lock 1 arranged on a first display screen box and secondary lock 2 arranged on a second display screen box, as shown in FIG. 1.

Figure 2:
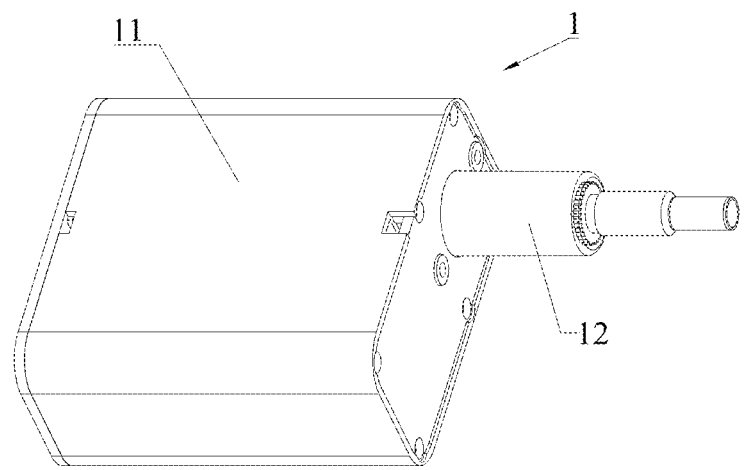
FIG. 2 is a schematic view showing the overall structure of the main lock of the electric lock in accordance with Example 1 of the present invention (from which the first connecting member projects)
Figure 3:
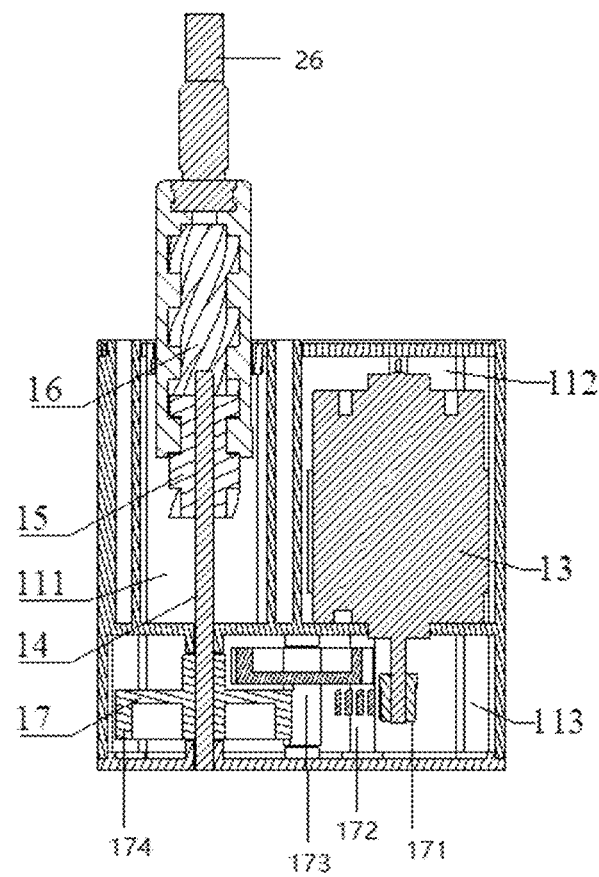
FIG. 3 is a cross-sectional view showing the main lock of the electric lock in accordance with Example 1 of the present invention (from which the first connecting member projects)
Figure 4:
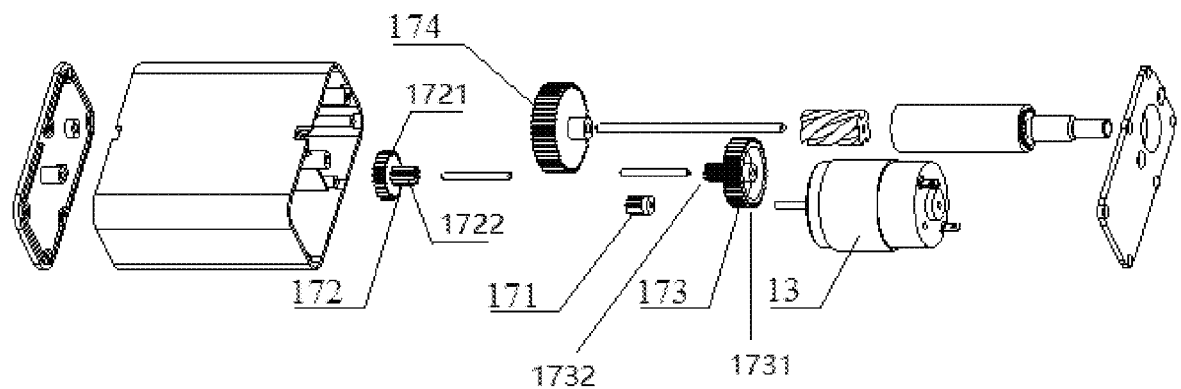
FIG. 4 is an exploded view showing the main lock of the electric lock in accordance with Example 1 of the present invention.
Figure 5:
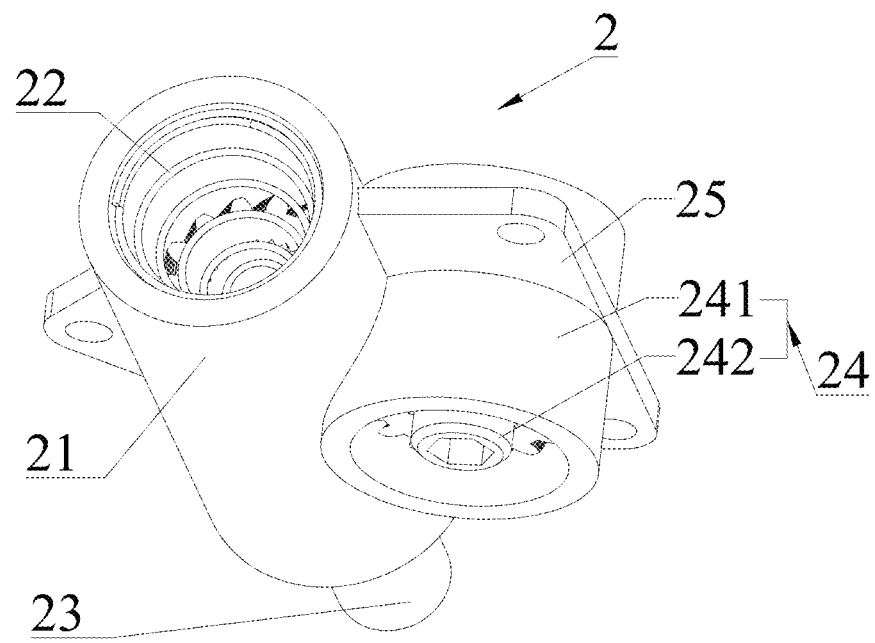
FIG. 5 is a schematic view showing the overall structure of the secondary lock of the electric lock in accordance with Example 1 of the present invention.
Figure 6:
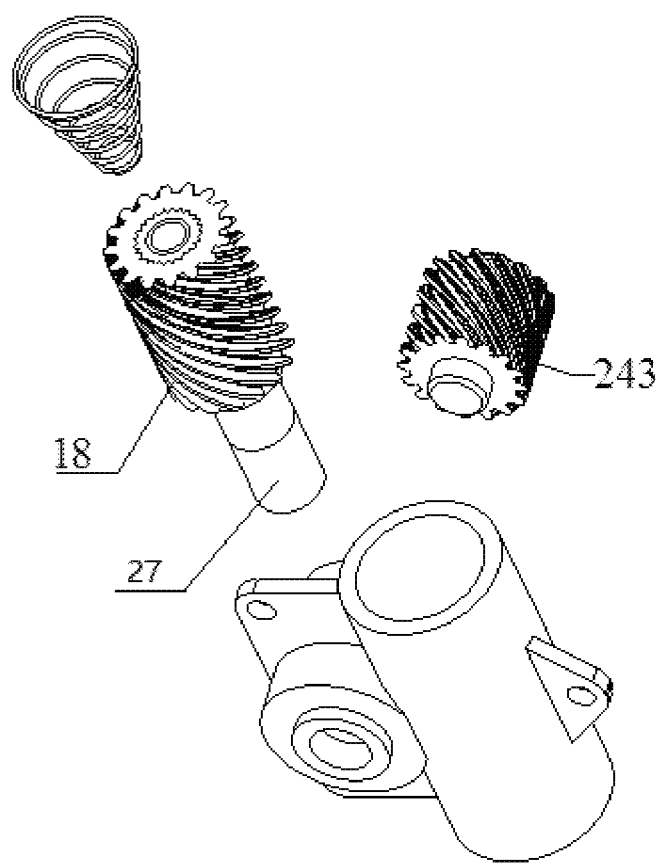
FIG. 6 is an exploded view showing the secondary lock of the electric lock in accordance with Example 1 of the present invention.

Referring to FIGS. 2-4, main lock 1 comprises a housing 11 accommodating a drive assembly and first connecting member 12. The driving assembly comprises driving member 13 and rotating shaft 14 which is rotatably arranged on housing 11. First threaded portion 15 is arranged at one end of rotating shaft 14. Second threaded portion 16 adapted to first threaded portion 15 is arranged at one end of first connecting member 12 while a third threaded portion is arranged at the other end. As shown in FIGS. 5 and 6, secondary lock 2 comprises first sleeve 21, elastic member 22 and second connecting member 23 which is rotatably arranged in first sleeve 21. Elastic member 22 is arranged in first sleeve 21 and has one end abutting against second connecting member 23. A fourth threaded portion adapted to the third threaded portion is arranged on second connecting member 23. Second connecting member 23 is able to move along the axis of first sleeve 21. Driving member 13 drives first connecting member 12 through rotating shaft 14 to move along the axis of rotating shaft 14. The rotation of rotating shaft 14 drives first connecting member 12 to rotate when first connecting member 12 abuts against second connecting member 23. First threaded portion 15 is preferably helical, that is, rotating shaft 14 drives first connecting member 12 by means of screw drive.

It will be understood that first threaded portion 15 may not be integrally formed with rotating shaft 14.

A through hole, for first connecting member 12 passing through, is arranged on the first display screen box and the second display screen box, respectively. Second connecting member 23 is aligned with the through hole.

A cover may be provided at the end of first sleeve 21 away from second connecting member 23, and the other end of elastic member 22 abuts against the cover. It will be understood that when the cover is not provided on first sleeve 21, the other end of elastic member 22 abuts against the side wall of the display screen box in which secondary lock 2 is received. In the case where first sleeve 21 is provided with a cover, the loss of elastic member 22 in the process of assembling or disassembling secondary lock 2 may be avoided. In this instance, elastic member 22 is a spring.

As shown in FIGS. 3 and 4, main lock 1 further comprises reduction gear set 17 arranged in housing 11, by which driving member 13 drives rotating shaft 14 to rotate. In this instance, reduction gear set 17 is a three-stage reduction mechanism. Specifically, reduction gear set 17 comprises first gear 171, second gear 172, third gear 173, and fourth gear 174. Second gear 172 comprises a first tooth portion in connection with a second tooth portion, and third gear 173 comprises a third tooth portion in connection with a fourth tooth portion. First gear 171 is sleeved onto the output shaft of driving member 13. Second gear 172 and third gear 173 are rotatably arranged in housing 11, respectively. Fourth gear 174 is sleeved onto rotating shaft 14. The outer diameter of the first tooth portion is greater than that of the second tooth portion and first gear 171, respectively. The outer diameter of the third tooth portion is greater than that of the second tooth portion and the fourth tooth portion, respectively. The outer diameter of fourth gear 174 is greater than that of the fourth tooth portion. First gear 171 engages with the first tooth portion, the second tooth portion engages with the third tooth portion, and the fourth tooth portion engages with fourth gear 174. It will be understood that reduction gear set 17 can be selected from deceleration mechanisms of other stages, in another instance.

In a preferred mode, housing 11 of main lock 1 is divided into three cavities, including left cavity 111, right cavity 112 and lower cavity 113. The length of lower cavity 113 is equal to the sum of the lengths of left cavity 111 and right cavity 112. Reduction gear set 17 is arranged in lower cavity 113, rotation shaft 14 and first connecting member 12 are arranged in left cavity 111, and driving member 13 is arranged in right cavity 112. In this instance, driving member 13 is a motor.

As shown in FIGS. 5 and 6, in order to prevent the electric lock from being unlocked due to power failure or sudden failure of driving member 13, secondary lock 2 further comprises manual unlocking assembly 24 comprising second sleeve 241 and unlocking member 242. Second sleeve 241 is arranged on the peripheral wall of first sleeve 21 and perpendicular to first sleeve 21. At the junction of first sleeve 21 and second sleeve 241, the hollow region of second sleeve 241 is communicated with the hollow region of first sleeve 21. Fifth threaded portion 243 is arranged on unlocking member 242, and unlocking member 242 is rotatably arranged in second sleeve 241. Sixth threaded portion 18 adapted to fifth threaded portion 243 is arranged on second connecting member 23. Both first threaded portion 15 and fifth threaded portion 243 have a larger lead angle, preferably ranging from 25° to 65°. The lead angles of first threaded portion 15 and fifth threaded portion 243 in accordance with the present invention are 45°, respectively. That is, the drive mode between unlocking member 242 and second connecting member 23 is still a screw drive.

In this instance, unlocking member 242 is of a cylindrical structure. Unlocking member 242 has an unlocking hole arranged along its axis, and the unlocking hole is selected from a flat-blade slot, a cross-shaped slot, a triangular slot, a regular hexagonal slot and a screw hole. By utilizing the unlocking hole, the worker may rotate the unlocking member with tools and unlock the electric lock. It is also allowable to provide the unlocking hole in a non-standard shape, which may be helpful for preventing others from maliciously unlocking the electric lock. In another instance, it is not necessary to provide the unlocking hole on the unlocking member. For example, it is also allowable to provide a rotating portion, by which people may manually rotate to unlock and disassemble the display screen boxes. An opening corresponding to the unlocking hole or the rotating portion is provided on the display screen box which the secondary lock is mounted on. The rotating portion extends out from the opening, or the worker can put the tool inside through the opening to unlock the electric lock.

As shown in FIGS. 5 and 6, secondary lock 2 further comprises a rib plate 25 arranged on the peripheral wall of first sleeve 21, and rib plate 25 is provided with a mounting hole. In this instance, two rib plates 25 are provided, wherein one rib plate 25 is arranged on a side opposite to second sleeve 241, and the other rib plate 25 is sleeved onto second sleeve 241 and is connected with first sleeve 21.

In summary, the electric lock and the display screen using the same provided by the present invention are simple in structure and small in size. The elastic member arranged in the secondary lock is beneficial to reducing the requirement of assembly precision of the electric lock, bringing great convenience to users. It is simple to operate since the connection and separation of the main lock and the secondary lock are electrically controlled. The manual unlocking member permits manual rotation and unlocking in the case of power failure or motor damage, which greatly improves the operability of the electric lock.

What is claimed is:

1. An electric lock, comprising
a main lock which comprises a housing accommodating a driving assembly and a first connecting member, the driving assembly comprising a driving member and a rotating shaft which is rotatably arranged on the housing, the rotating shaft having a first threaded portion at one end; the first connecting member having a second threaded portion at one end, and a third threaded portion at the other end; the second threaded portion being engageable with the first threaded portion; and
a secondary lock which comprises a first sleeve, an elastic member and a second connecting member which is rotatably arranged in the first sleeve, the elastic member being arranged in the first sleeve and having one end abutting against the second connecting member, the second connecting member having a fourth threaded portion engageable with the third threaded portion, the second connecting member being able to move along the axis of the first sleeve;
wherein the driving member drives, via the rotating shaft, the first connecting member to move along the axis of the rotating shaft and to screw in the second connecting member, and
wherein the secondary lock further comprises a manual unlocking assembly comprising a second sleeve and an unlocking member; the unlocking member having a fifth threaded portion, and the unlocking member is rotatably arranged in the second sleeve; the second connecting member having a sixth threaded portion fitted to the fifth threaded portion.

2. The electric lock according to claim 1, wherein the main lock further comprises a reduction gear set arranged in the housing, and the driving member drives the rotating shaft to rotate by the reduction gear set.

3. The electric lock according to claim 2, wherein the reduction gear set comprises a first gear, a second gear, a third gear and a fourth gear, and
wherein the second gear comprises a first tooth portion in connection with a second tooth portion, the third gear comprises a third tooth portion in connection with a fourth tooth portion; and
wherein the first gear is sleeved onto the output shaft of the driving member, and the second gear and the third gear are rotatably arranged in the housing, respectively; the fourth gear is sleeved onto the rotating shaft; and
wherein the outer diameter of the first tooth portion is greater than the outer diameter of the second tooth portion and the first gear, respectively; the outer diameter of the third tooth portion is greater than the outer diameter of the second tooth portion and the fourth tooth portion, respectively; the outer diameter of the fourth gear is greater than the outer diameter of the fourth tooth portion; and
wherein the first gear engages with the first tooth portion, the second tooth portion engages with the third tooth portion, and the fourth tooth portion engages with the fourth gear so as to transmit rotation motion from the driving member to the rotating shaft.

4. The electric lock according to claim 1, wherein the second sleeve is arranged on the peripheral wall of the first sleeve and perpendicular to the first sleeve; at the junction of the first sleeve and the second sleeve, the hollow region of the second sleeve is communicated with the hollow region of the first sleeve.

5. The electric lock according to claim 4, wherein the unlocking member has an unlocking hole arranged along its axis.

6. The electric lock according to claim 5, wherein the unlocking hole is selected from a flat-blade slot, a cross-shaped slot, a triangular slot, a regular hexagonal slot and a screw hole.

7. The electric lock according to claim 1, wherein a cover is provided at the end of the first sleeve away from the second connecting member, and the other end of the elastic member abuts against the cover.

8. The electric lock according to claim 1, wherein the secondary lock further comprises a rib plate arranged on a peripheral wall of the first sleeve, and the rib plate is provided with a mounting hole.

9. A display screen, wherein adjacent display screen boxes are connected by the electric lock according to claim 1.

10. The display screen according to claim 9, wherein the main lock is arranged on a first display screen box, and the secondary lock is arranged on a second display screen box; and
wherein a through hole, for the first connecting member passing through, is arranged on the first display screen box and the second display screen box, respectively; the second connecting member is aligned with the through hole.

* * * * *